United States Patent
Ishida et al.

(10) Patent No.: US 12,532,663 B2
(45) Date of Patent: Jan. 20, 2026

(54) THERMOELECTRIC CONVERSION ELEMENT

(71) Applicant: NEC Corporation, Tokyo (JP)

(72) Inventors: Masahiko Ishida, Tokyo (JP); Yasutomo Omori, Tokyo (JP); Akihiro Kirihara, Tokyo (JP); Hiroko Someya, Tokyo (JP)

(73) Assignee: NEC CORPORATION, Tokyo (JP)

( * ) Notice: Subject to any disclaimer, the term of this patent is extended or adjusted under 35 U.S.C. 154(b) by 428 days.

(21) Appl. No.: 18/105,546

(22) Filed: Feb. 3, 2023

(65) Prior Publication Data

US 2023/0270009 A1    Aug. 24, 2023

(30) Foreign Application Priority Data

Feb. 18, 2022  (JP) .................. 2022-023904

(51) Int. Cl.
  *H10N 15/20*   (2023.01)
  *C22C 19/00*   (2006.01)
  *C22C 19/07*   (2006.01)
  *C22C 28/00*   (2006.01)

(52) U.S. Cl.
  CPC .......... *H10N 15/20* (2023.02); *C22C 19/007* (2013.01); *C22C 19/07* (2013.01); *C22C 28/00* (2013.01); *C22C 2202/02* (2013.01)

(58) Field of Classification Search
  CPC ...... H10N 15/20; H10N 15/00; C22C 19/007; C22C 19/07
  See application file for complete search history.

(56) References Cited

FOREIGN PATENT DOCUMENTS

| | | |
|---|---|---|
| JP | H10-032113 A | 2/1998 |
| JP | 2004-119647 A | 4/2004 |
| JP | 2004-253618 A | 9/2004 |
| JP | 2008-021982 A | 1/2008 |
| JP | 2021-039996 A | 3/2021 |
| JP | 2022-024463 A | 2/2022 |
| WO | 2009/151000 A1 | 12/2009 |
| WO | 2019/064972 A1 | 4/2019 |

OTHER PUBLICATIONS

Priyanka, D. Shobana, et al. "Cobalt based new quaternary Heusler alloys for Spintronic and thermoelectric applications: an Ab-initio study." Materials Technology 37.11 (2022): 1936-1946.*

(Continued)

*Primary Examiner* — Jessee R Roe
(74) *Attorney, Agent, or Firm* — Sughrue Mion, PLLC

(57) ABSTRACT

Provided is a thermoelectric conversion element having a high Anomalous Nernst Effect at a lower cost. A thermoelectric conversion element (1) includes a magnetic alloy material containing aluminum, cobalt, and samarium, and a power generation layer (10), in which in the power generation layer (10), a content of aluminum in the magnetic alloy material is in a range of 1 atomic percent to 40 atomic percent, a content of samarium in the magnetic alloy material is in a range of 12 atomic percent to 40 atomic percent, and a content of cobalt in the magnetic alloy material is in a range of 57 atomic percent to 82 atomic percent.

10 Claims, 11 Drawing Sheets

(56) References Cited

OTHER PUBLICATIONS

A. Miura, H. Sepehri-Amin, K. Masuda, H. Tsuchiura, Y. Miura, R. Iguchi, Y. Sakuraba, J. Shiomi, K. Hono, K. Uchida, "Observation of anomalous Ettingshausen effect and large transverse thermoelectric conductivity in permanent magnets", Applied Physics Letters 115 222403 (2019).

S. Isogami, T.Takanashi, M. Mizuguchi, "Dependence of anomalous Nernst effect on crystal orientation in highly ordered γ-Fe4N films with anti-perovskite structure", Applied Physics Express 10, 073005 (2017).

K. Uchida, T. Nonaka, T. Ota, E. Saitoh, "Longitudinal spin-Seebeck effect in sintered polycrystalline (MnZn)Fe2O4", Applied Physics Letters. 97, 262504 (2010).

B. Miao, S. Huang, D. Qu, C. Chien, "Inverse Spin Hall Effect in a Ferromagnetic Metal", Physical Review Letters. 111, 066602 (2013).

JP Office Communication for JP Application No. 2022-023904, mailed on Nov. 4, 2025 with English Translation.

\* cited by examiner

THERMOELECTRIC COEFFICIENT
OF AlCoSm ALLOY

THERMOELECTRIC CONVERSION ELEMENT

This application is based upon and claims the benefit of priority from Japanese Patent Application No. 2022-023904, filed on Feb. 18, 2022, the disclosure of which is incorporated herein in its entirety by reference.

TECHNICAL FIELD

The present disclosure relates to a thermoelectric conversion element, and particularly relates to a thermoelectric conversion element containing a magnetic alloy material.

BACKGROUND ART

As one of thermal management technologies for a sustainable society, expectations for thermoelectric conversion are increasing. Heat is an energy source that can be recovered in various situations such as body temperature, solar heat, and industrial exhaust heat. Therefore, it is expected that expectations for thermoelectric conversion further increase in various applications such as high efficiency of energy use, power supply to a mobile terminal, a sensor, and the like, and visualization of heat flow by heat flow sensing.

A thermoelectric conversion element (an example of a thermoelectric element) is also used as a heat flow sensor that measures a flow of heat. The heat flow sensor is an element technology having a function different from that of the temperature sensor in the heat management system, and attempts have been made to apply the heat flow sensor to various applications.

Patent Documents (JP 2004-119647 A, JP 2004-253618 A, and JP 2008-021982 A) disclose a thermoelectric conversion element containing an iron-vanadium-aluminum-based (FeVAl) compound having a Heusler structure. In the thermoelectric conversion elements described in Patent Documents, when a temperature difference is given between both main surfaces, holes and electrons move along a direction of the temperature difference, and the Seebeck effect is exhibited, so that an electromotive force is generated between both terminals.

In recent years, a thermoelectric conversion element including a magnetic alloy material that converts an applied temperature gradient into a charge current has been developed. For such a thermoelectric conversion element, a magnetic alloy material exhibiting the Anomalous Nernst Effect or the Spin Seebeck Effect by a temperature gradient is used.

The thermoelectric conversion element exhibiting the Anomalous Nernst Effect includes a magnetic metal magnetized in one direction. When a temperature gradient is applied to the magnetic alloy material exhibiting the Anomalous Nernst Effect, a heat flow generated by the temperature gradient is converted into a charge current in the magnetic metal. At this time, a direction of the charge current is orthogonal to both a magnetization direction and a temperature gradient direction. Due to this characteristic, the thermoelectric conversion element using the Anomalous Nernst Effect has a simple structure as compared with the element using the Seebeck effect, and thus application to various applications can be expected.

Non-Patent Document (A. Miura, H. Sepehri-Amin, K. Masuda, H. Tsuchiura, Y. Miura, R. Iguchi, Y. Sakuraba, J. Shiomi, K. Hono, K. Uchida "Observation of anomalous Ettingshausen effect and large transverse thermoelectric conductivity in permanent magnets", Appl. Phys. Letters 115 222403 (2019)) discloses a samarium-cobalt ($SmCo_5$) alloy as a magnetic alloy material which exhibits a large anomalous etching Schausen effect and can be estimated to have a large Anomalous Nernst Effect which is an adverse effect. Non-Patent Document (S. Isogami, T. Takanashi, M. Mizuguchi, "Dependence of anomalous Nernst effect on crystal orientation in highly ordered $\gamma$-$Fe_4N$ films with anti-perovskite structure", Appl. Phys. Express 10, 073005 (2017)) discloses an iron nitride-based ($\gamma'$-$Fe_4N$) material and an iron-aluminum-based ($Fe_{80}Al_{20}$) alloy as a magnetic alloy material exhibiting the Anomalous Nernst Effect. The magnetic alloy material described in Non-Patent Documents 1 and 2 is a thin film type element formed by forming a thin film crystal of a ferromagnetic alloy material on a nonmagnetic substrate.

A thermoelectric conversion element using the Spin Seebeck Effect has a two-layer structure of a magnetic insulator layer having magnetization in one direction and an electromotive body layer having conductivity. When a temperature gradient is applied in an out-of-plane direction of the thermoelectric conversion element using the Spin Seebeck Effect, a flow of spin angular momentum called spin current is induced in a magnetic insulator by the Spin Seebeck Effect. When the spin current induced in the magnetic insulator is injected into the electromotive body layer, a charge current flows in an in-plane direction of the electromotive film due to the Inverse Spin Hall effect. Since the thermoelectric conversion element using the Spin Seebeck Effect is configured using a magnetic insulator having a relatively small thermal conductivity, it is possible to maintain a temperature difference for performing effective thermoelectric conversion.

Patent Document (WO-A-2009/151000) discloses a thermoelectric conversion element in which yttrium gallium iron garnet (hereinafter, referred to as YIG) of a single crystal is used as a magnetic insulator layer and a platinum wire is used as an electromotive body layer. Non-Patent Document (K. Uchida, T. Nonaka, T. Ota, E. Saitoh, "Longitudinal spin-Seebeck effect in sintered polycrystalline (MnZn) $Fe_2O_4$", Appl. Phys. Lett. 97, 262504 (2010)) discloses a thermoelectric conversion element in which a sintered body of polycrystalline Mn—Zn ferrite is used as a magnetic insulator layer and a platinum thin film is used as an electromotive body layer.

Non-Patent Document (B. Miao, S. Huang, D. QU, C. Chien, "Inverse Spin Hall Effect in a Ferromagnetic Metal", Phys. Rev. Lett. 111, 066602 (2013)) discloses a hybrid thermoelectric element (also referred to as a spin thermoelectric element) using both the Spin Seebeck Effect and the Anomalous Nernst Effect. Since both the Spin Seebeck Effect and the Anomalous Nernst Effect have the same symmetry of inducing the electromotive force in the in-plane direction by the temperature gradient in the out-of-plane direction, thermoelectric conversion efficiency can be improved by combining the two effects. Non-patent documents do not disclose any material other than permalloy, which is an alloy of nickel and iron, and thus, when designing a hybrid element using both the Spin Seebeck Effect and the Anomalous Nernst Effect, knowledge and guidelines for further improving the thermoelectric conversion efficiency are required.

SUMMARY

Thermoelectric conversion elements using the Anomalous Nernst Effect and the Spin Seebeck Effect have a problem of improving thermoelectric conversion efficiency for practical use. In addition, as a result of considering the cost of the thermoelectric conversion element with respect to the expected value of the recovered energy, it can be said that the investment effect cannot be obtained in most cases, and thus, the widespread use has not progressed. Cost reduction is also an important issue for promoting widespread use of heat flow sensors.

In particular, Non-Patent Document (A. Miura, H. Sepehri-Amin, K. Masuda, H. Tsuchiura, Y. Miura, R. Iguchi, Y. Sakuraba, J. Shiomi, K. Hono, K. Uchida "Observation of anomalous Ettingshausen effect and large transverse thermoelectric conductivity in permanent magnets", Appl. Phys. Letters 115 222403 (2019)) describes that a thermoelectric conversion element can obtain a relatively large thermoelectric effect when the atomic composition ratio of cobalt to samarium is 5:1. However, since both cobalt and samarium are rare metals, the raw material cost is high.

An object of the present disclosure is to provide a thermoelectric conversion element having a high Anomalous Nernst Effect at a lower cost in order to solve the above-described problems.

BRIEF DESCRIPTION OF THE DRAWINGS

Exemplary features and advantages of the present invention will become apparent from the following detailed description when taken with the accompanying drawings in which.

EXAMPLE EMBODIMENT

Figure 1:
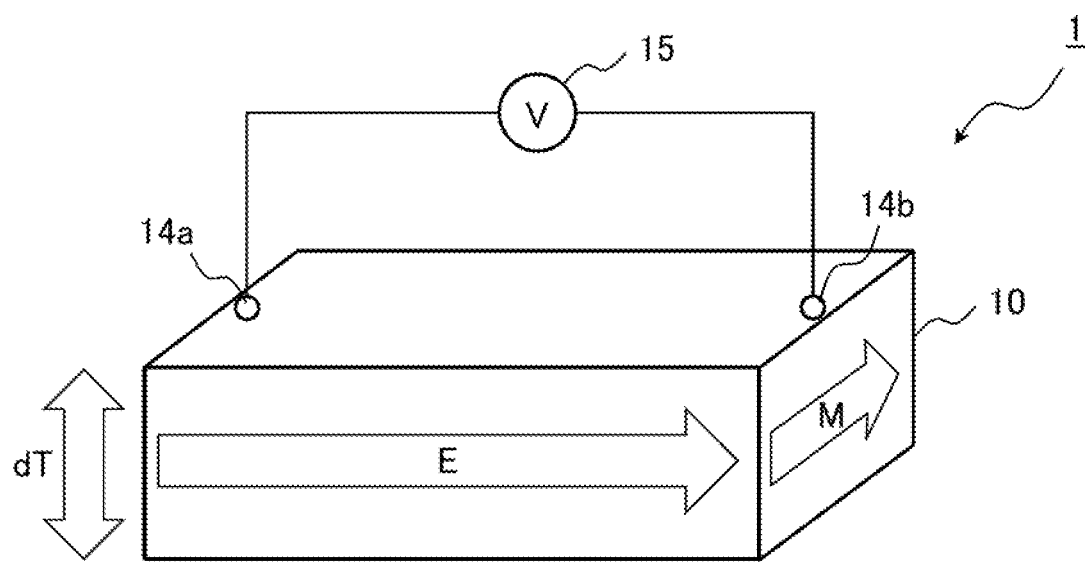
FIG. 1 is a conceptual diagram illustrating an example of a thermoelectric conversion element according to a first example embodiment.
Figure 1:
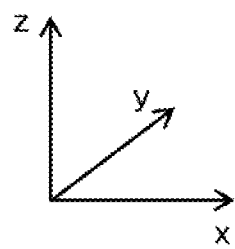

Hereinafter, modes for carrying out the present disclosure will be described with reference to the drawings. However, the example embodiments described below have technically preferable limitations for carrying out the present disclosure, but the scope of the invention is not limited to the following. In all the drawings used in the following descriptions of the example embodiments, the same reference numerals are given to the same parts unless there is a particular reason. In the following example embodiments, repeated description of similar configurations and operations may be omitted.

In the following example embodiment, a thermoelectric conversion element having a power generation layer using an aluminum-cobalt-samarium-based (AlCoSm) alloy containing aluminum (Al), cobalt (Co), and samarium (Sm) as main components as a magnetic alloy material will be described. The AlCoSm alloy illustrated in the following example embodiments achieves higher thermoelectric conversion efficiency than a cobalt-samarium-based (CoSm) alloy not using aluminum, a cobalt-aluminum-based (CoAl) alloy not using samarium, a cobalt-platinum-based (CoPt) alloy containing platinum (Pt), or the like, with a composition containing Al which is a lower cost raw material metal.

First Example Embodiment

First, a thermoelectric conversion element according to a first example embodiment will be described with reference to the drawings. The thermoelectric conversion element of the present example embodiment has a power generation layer containing an aluminum-cobalt-samarium-based alloy (AlCoSm alloy) containing aluminum (Al), cobalt (Co), and samarium (Sm) as main components.

FIG. 1 is a conceptual diagram illustrating an example of a thermoelectric conversion element 1 of the present example embodiment. Thermoelectric conversion element 1 includes a power generation layer 10 (an example of a thermoelectric conversion layer) containing an AlCoSm alloy. FIG. 1 illustrates a voltmeter 15 which installs an electrode terminal 14a and an electrode terminal 14b on one main surface of the power generation layer 10 and measures a voltage between the electrode terminal 14a and the electrode terminal 14b. Hereinafter, an in-plane direction indicates a direction parallel to the main surface of the power generation layer 10, and an out-of-plane direction indicates a direction perpendicular to the main surface of the power generation layer 10.

The thermoelectric conversion element 1 includes the power generation layer 10 containing an AlCoSm alloy containing Al, Co, and Sm as main components. The AlCoSm alloy is a ferromagnetic and has magnetization M in the in-plane direction (y direction in the drawing).

When a temperature gradient (temperature difference dT) is applied in the out-of-plane direction (z direction in FIG. 1) of the power generation layer 10, an electromotive force E is generated in the in-plane direction (x direction in FIG. 1) perpendicular to the directions of the magnetization M and the temperature difference dT by an Anomalous Nernst Effect. Thermoelectric conversion can be performed by extracting the electromotive force E in the in-plane direction (x direction in FIG. 1) perpendicular to the directions of magnetization M and temperature difference dT as electricity from between the electrode terminal 14a and the electrode terminal 14b.

The power generation layer 10 contains an AlCoSm (aluminum-cobalt-samarium-based) alloy containing Al, Co, and Sm as a magnetic alloy material. In the power generation layer 10, it is preferable that a composition ratio of Al is equal to or more than 1 atomic percent and less than 40 atomic percent, a composition ratio of Sm is equal to or more than 12 atomic percent and less than 40 atomic percent, and a composition ratio of Co is equal to or more than 57 atomic percent and less than 82 atomic percent.

In a more preferred configuration of the power generation layer 10, the composition ratio of Al is equal to or more than 15 atomic percent and less than 35 atomic percent, the composition ratio of Sm is equal to or more than 15 atomic percent and less than 25 atomic percent, and the composition ratio of Co is equal to or more than 57 atomic percent and less than 65 atomic percent.

In a further preferred configuration of the power generation layer 10, the composition ratio of Al is equal to or more than 1 atomic percent and less than 10 atomic percent, the composition ratio of Sm is equal to or more than 25 atomic percent and less than 40 atomic percent, and the composition ratio of Co is equal to or more than 57 atomic percent and less than 70 atomic percent.

The AlCoSm alloy of the power generation layer 10 may contain impurities other than Al, Co, and Sm at 30 atomic percent (at %) or less as long as the composition ratio of Al, Co, and Sm falls within the above-described range. Examples of the effective impurity element include iron (Fe) and nickel (Ni). For example, up to 30% of Fe may be added to the AlCoSm alloy. In this case, since the AlCoSm alloy has a composition ratio of Al 20%, Co 30%, and Sm 20%, amounts of Co and Sm contained in the power generation layer 10 can be reduced without impairing a thermoelectric effect, and a raw material cost of the thermoelectric conversion element 1 can be reduced.

As described above, the thermoelectric conversion element of the present example embodiment includes the power generation layer 10 containing the magnetic alloy material of the aluminum-cobalt-samarium-based alloy. When a temperature gradient is applied, the power generation layer 10 generates an electromotive force in a direction substantially perpendicular to each of a magnetization direction of the magnetic alloy material and a direction of the applied temperature gradient due to the Anomalous Nernst Effect exhibited by the magnetic alloy material.

In one aspect of the present example embodiment, the power generation layer 10 has a plate-like shape including two facing main surfaces, and the magnetic alloy material is magnetized in an in-plane direction of the main surfaces. When the temperature gradient is applied in the out-of-plane direction of the main surface, the power generation layer 10 generates an electromotive force in the direction substantially perpendicular to each of the magnetization direction of the magnetic alloy material and the direction of the applied temperature gradient.

According to the AlCoSm alloy contained in the power generation layer 10 of the thermoelectric conversion element 1 of the present example embodiment, a large electromotive force about several times as large as that of the FePt alloy or the CoPt alloy, or about the same as that of the SmCo alloy can be obtained.

That is, according to the present example embodiment, it is possible to provide a thermoelectric conversion element including a thermoelectric material having a large Anomalous Nernst Effect at lower cost.

Second Example Embodiment

Next, a thermoelectric conversion element according to a second example embodiment will be described with reference to the drawings. The thermoelectric conversion element of the present example embodiment includes a power generation layer having a structure in which a conductive magnetic layer (also referred to as a first magnetic layer) exhibiting the Anomalous Nernst Effect and an insulating magnetic layer (also referred to as a second magnetic layer) exhibiting the Spin Seebeck Effect are laminated.

Figure 2:
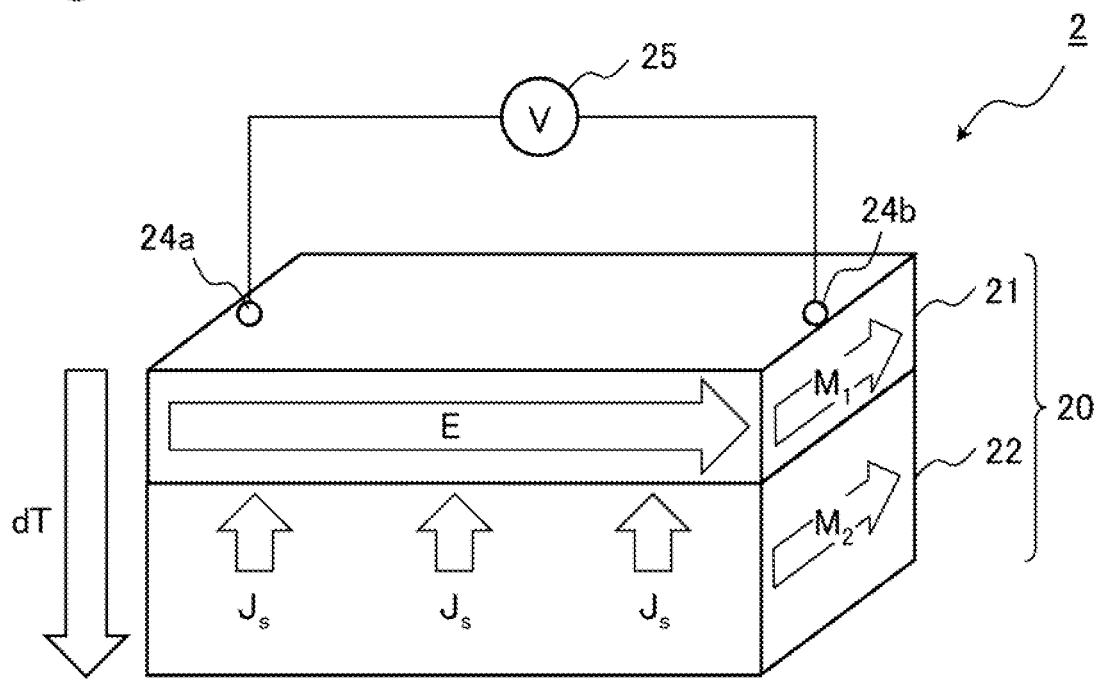
FIG. 2 is a conceptual diagram illustrating an example of a thermoelectric conversion element according to a second example embodiment.

FIG. 2 is a conceptual diagram illustrating an example of a thermoelectric conversion element 2 of the present example embodiment. The thermoelectric conversion element 2 includes a power generation layer 20 having the structure in which the first magnetic layer 21 and the second magnetic layer 22 are laminated. FIG. 2 illustrates a voltmeter 25 which installs an electrode terminal 24a and an electrode terminal 24b on one main surface of the power generation layer 20 and measures a voltage between the electrode terminal 24a and the electrode terminal 24b.

The first magnetic layer 21 is a layer of a magnetic alloy material having a large Anomalous Nernst Effect. The first magnetic layer 21 has magnetization $M_1$ in one direction (y direction in FIG. 2). The AlCoSm alloy of the first example embodiment is preferably applied to the first magnetic layer 21.

For example, the first magnetic layer 21 can be formed using a sputtering method, a plating method, a vacuum vapor deposition method, or the like.

The first magnetic layer 21 has two roles. The first is a role of spin flow-charge current conversion for converting a spin current flowing in by the Spin Seebeck Effect of the second magnetic layer 22 into an electromotive force (electric field $E_{SSE}$) by the Inverse Spin Hall effect (SSE: Spin Seebeck Effect). The second role is to generate an electromotive force (electric field $E_{ANE}$) directly from a temperature difference dT by the Anomalous Nernst Effect (ANE: Anomalous Nernst Effect).

A direction of the electric field $E_{ANE}$ generated by the Anomalous Nernst Effect is defined by an outer product of the magnetization $M_1$ of the first magnetic layer 21 and the temperature difference dT as expressed in the following Formula 1.

[Math. 1]

$$E_{ANE} \propto M_1 \times d_T \qquad (1)$$

The second magnetic layer 22 is a layer of a magnetic alloy material exhibiting the Spin Seebeck Effect. Similarly to the first magnetic layer 21, the second magnetic layer 22 has magnetization $M_2$ in one direction (y direction in FIG. 3). The second magnetic layer 22 contains a magnetic alloy material such as yttrium iron garnet (YIG), Bi-added YIG (Bi:YiG), or nickel zinc ferrite (NiZn ferrite). Examples of the yttrium iron garnet include $Y_3Fe_5O_{12}$ and $BiY_2Fe_5O_{12}$ to which Bi is added. Examples of the NiZn ferrite include $(Ni,Zn)_xFe_{3-x}O_4$ (x is a positive number of 1 or less).

For example, the second magnetic layer 22 can be formed by using a sputtering method, an organometallic decomposition method, a pulse laser deposition method, a sol-gel method, an aerosol deposition method, a ferrite plating method, a liquid phase epitaxy method, or the like. In this case, the thermoelectric conversion element 2 is formed on a certain substrate.

When the temperature difference dT in the out-of-plane direction (z direction in FIG. 2) is applied to the main surface of the second magnetic layer 22, a spin current $J_s$ is generated by the Spin Seebeck Effect. A direction of the spin current $J_s$ is a direction (z direction in FIG. 2) parallel or antiparallel to the direction (z direction in FIG. 2) of the temperature difference dT. In the example of FIG. 2, when the temperature difference dT in the −z direction is applied to the second magnetic layer 22, a spin current $J_s$ along the +z direction or the −z direction is generated. When the spin current $J_s$ is generated at an interface between the first magnetic layer 21 and the second magnetic layer 22, an electromotive force in an in-plane direction is generated in the first magnetic layer 21 by the Inverse Spin Hall effect.

The second magnetic layer 22 desirably has low thermal conductivity from the viewpoint of thermoelectric conversion efficiency. Therefore, it is desirable to use a magnetic insulator having no conductivity or a magnetic semiconductor having a relatively large electric resistance for the second magnetic layer 22.

A direction of the electric field $E_{SSE}$ generated by the Spin Seebeck Effect is defined by an outer product of the magnetization $M_2$ of the second magnetic layer 22 and the temperature difference dT as expressed by the following Formula 2.

[Math. 2]

$$E_{SSE} \propto M_1 \times dT \quad (2)$$

Although a sign of an actual electric field also depends on the material, in the case of the element configuration of the thermoelectric conversion element 2, when the directions of the magnetization $M_1$ and the magnetization $M_2$ are the same, both the electric field $E_{SSE}$ and the electric field $E_{ANE}$ are generated in the same direction with respect to a certain temperature difference dT. Therefore, under such conditions, the Anomalous Nernst Effect and the Spin Seebeck Effect intensify each other, and an absolute value of the generated electric field becomes a value ($E_{Hybrid}$) obtained by adding electromotive forces due to the two effects as illustrated in the following Formula 3.

[Math. 3]

$$|E_{Hybrid}| = |E_{SSE}| + |E_{ANE}| \quad (3)$$

In the example of FIG. 2, the directions of the magnetization $M_1$ of the first magnetic layer 21 and the magnetization $M_2$ of the second magnetic layer 22 are the +y direction, the direction of the temperature difference dT is the −z direction, and the direction of the electromotive force generated in the first magnetic layer 21 is the +x direction.

In order to effectively perform thermoelectric conversion in the power generation layer 20, it is required to maintain the temperature difference dT. In order to maintain the temperature difference dT, a thickness of the second magnetic layer 22 is desirably equal to or more than 1 μm. In order to effectively exhibit the Spin Seebeck Effect, it is required to avoid the influence of the dissipation of the spin current in the film. In order to avoid the influence of dissipation of the spin current in the film, desirably, the film thickness of the first magnetic layer 21 is equal to or less than 100 nanometers. In order to support the entire thermoelectric conversion element 2, a substrate may be provided below the second magnetic layer 22.

As described above, the thermoelectric conversion element 2 of the present example embodiment includes the power generation layer having the structure in which the first magnetic layer 21 exhibiting the Anomalous Nernst Effect and the second magnetic layer 22 exhibiting the Spin Seebeck Effect are laminated. That is, the thermoelectric conversion element of the present example embodiment has the power generation layer having the structure in which the first magnetic layer 21 containing a magnetic alloy material and the second magnetic layer 22 exhibiting the Spin Seebeck Effect by application of a temperature gradient are laminated. For example, preferably, the thickness of the first magnetic layer 21 is equal to or less than 100 nanometers.

In the thermoelectric conversion element 2 of the present example embodiment, the Anomalous Nernst Effect and the Spin Seebeck Effect can be used in combination by the structure in which the first magnetic layer 21 containing a magnetic alloy material and the second magnetic layer 22 exhibiting the Spin Seebeck Effect by application of a temperature gradient are laminated. Therefore, according to the thermoelectric conversion element 2 of the present example embodiment, it is possible to generate a larger thermoelectromotive force than the thermoelectric conversion element 1 of the first example embodiment.

Third Example Embodiment

Next, a thermoelectric conversion element according to a third example embodiment will be described with reference to the drawings. The thermoelectric conversion element of the present example embodiment includes a power generation layer having a structure in which a conductive magnetic network exhibiting an Anomalous Nernst Effect and insulating magnetic particles exhibiting a Spin Seebeck Effect are combined.

Figure 3:
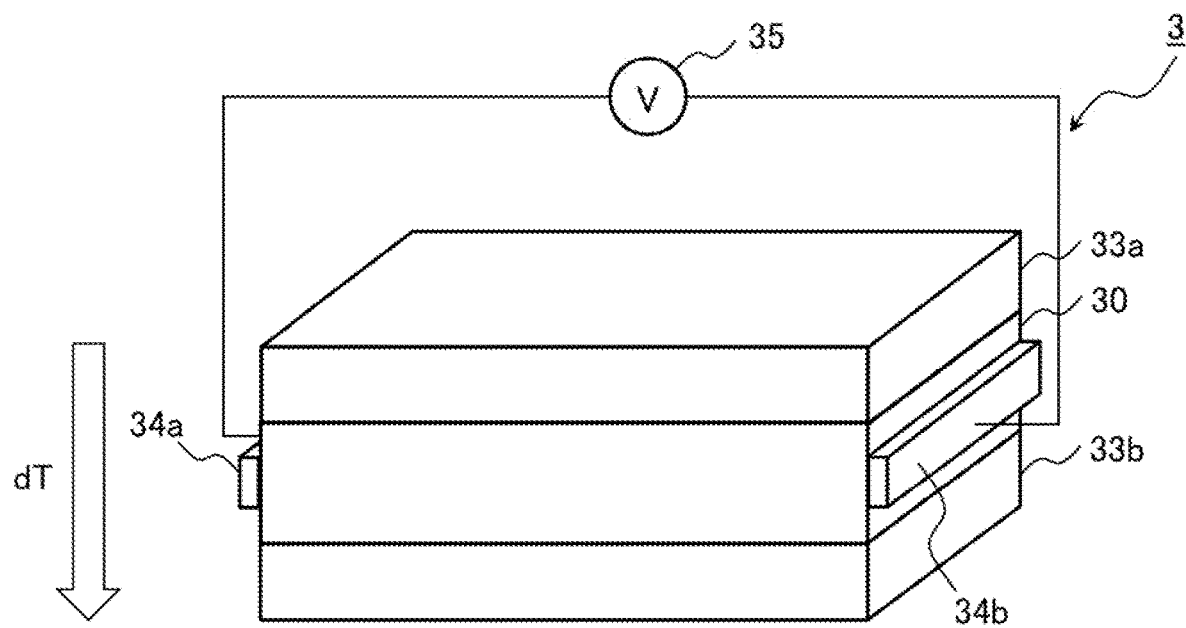
FIG. 3 is a conceptual diagram illustrating an example of a thermoelectric conversion element according to a third example embodiment.
Figure 3:
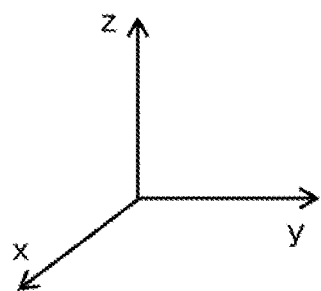

FIG. 3 is a conceptual diagram illustrating an example of a thermoelectric conversion element 3 of the present example embodiment. The thermoelectric conversion element 3 has a structure in which a power generation layer 30 is interposed between a first support layer 33a and a second support layer 33b. FIG. 3 illustrates a voltmeter 35 which installs an electrode terminal 34a and an electrode terminal 34b on two facing end surfaces of the power generation layer 30, and measures a voltage between the electrode terminal 34a and the electrode terminal 34b.

Figure 4:
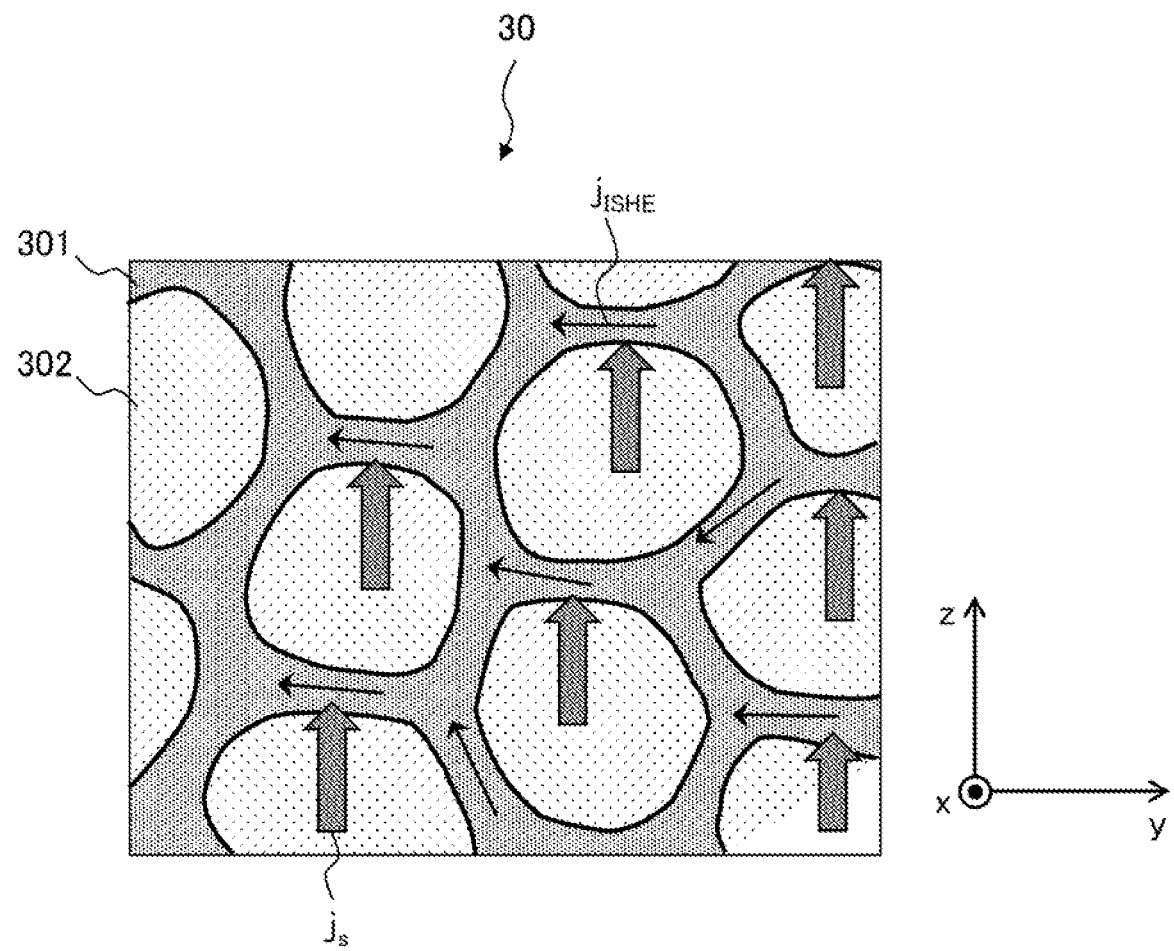
FIG. 4 is a conceptual diagram illustrating an example of a structure of an aluminum-cobalt-samarium-based alloy network body included in the thermoelectric conversion element according to the third example embodiment.

FIG. 4 is a conceptual diagram illustrating an example of a structure of the power generation layer 30. FIG. 4 is a view of a cross section of the power generation layer 30 cut along a zy plane as viewed from a viewpoint in the +x direction. The power generation layer 30 includes a magnetic network 301 and granular magnetic particles 302 dispersed inside the magnetic network 301. In other words, in the power generation layer 30, the granular magnetic particles 302 are arranged to be isolated from each other, and the magnetic network 301 spreads in a net shape so as to fill gaps between the particles of the magnetic particles 302.

The magnetic network 301 includes a magnetic alloy material having a large Anomalous Nernst Effect. The AlCoSm alloy of the first example embodiment is preferably applied to the magnetic network 301.

Since the magnetic network 301 has a three-dimensional network structure inside the power generation layer 30, the electrode terminal 34a and the electrode terminal 34b are electrically connected.

The magnetic particles 302 contain a magnetic alloy material exhibiting the Spin Seebeck Effect. The magnetic particles 302 contain a magnetic alloy material such as yttrium iron garnet (YIG) or nickel zinc ferrite (NiZn ferrite). For example, as the yttrium iron garnet, $Y_3Fe_5O_{12}$ is exemplified. For example, as the NiZn ferrite, $(Ni,Zn,Fe)_3O_4$ is exemplified.

The magnetic particles 302 have magnetization in an in-plane direction (x direction in FIG. 4). In order to maximize the power generation efficiency, a particle size of each of the magnetic particles 302 is desirably about a relaxation length of the spin current (Magnon flow) induced by the Spin Seebeck Effect. Specifically, desirably, an average particle diameter of the magnetic particles 302 is equal to or more than 300 nm and equal to or less than 10 µm.

On both main surfaces of the power generation layer 30, the first support layer 33a and the second support layer 33b are disposed. The first support layer 33a is disposed on an upper surface (also referred to as a first surface) of the power generation layer 30. The second support layer 33b is disposed on the lower surface (also referred to as a second surface) of the power generation layer 30. In the thermoelectric conversion element 3, the power generation layer 30 is supported by the first support layer 33a and the second support layer 33b, so that the strength of the entire element is increased.

For the first support layer 33a and the second support layer 33b, it is desirable to use an insulator material that does not conduct electricity or a semiconductor material having a resistivity equal to or more than 1 ohm-meter (Ωm) in order to extract the electromotive force generated in the power generation layer 30 to the outside without loss.

A material constituting the first support layer 33a and the second support layer 33b is desirably lower in melting point than a metal material or a magnetic insulator material constituting the power generation layer 30 for the convenience of manufacturing the thermoelectric conversion element 3. The magnetic particles 302 exhibiting the Spin Seebeck Effect are used in a temperature range equal to or less than a Curie temperature of the magnetic body contained in the magnetic particles 302. Therefore, the melting points of the materials of the first support layer 33a and the second support layer 33b are preferably higher than the Curie temperature of the magnetic particles 302 so as not to melt in the temperature range equal to or lower than the Curie temperature of the magnetic material contained in the magnetic particles 302.

That is, when a sample of the thermoelectric conversion element 3 is prepared, a sintering temperature of the thermoelectric conversion element 3 is set between minimum sintering temperatures of the first support layer 33a and the second support layer 33b and a minimum sintering temperature of the power generation layer 30. As described above, when a material having a low melting point (and sintering temperature) is used as the first support layer 33a and the second support layer 33b, the thermoelectric conversion element 3 can be integrally solidified with high strength by the low-temperature heat treatment lower than the original sintering temperature of the power generation layer 30.

For example, it is assumed that ferrite having a Curie temperature of 300 to 400° C. and a melting point of 1200 to 1700° C. is used as the magnetic particles 302. In this case, desirably, the melting point of the material constituting the first support layer 33a and the second support layer 33b is equal to or more than 400° C. and equal to or less than 1200° C. Specifically, bismuth oxide $Bi_2O_3$, molybdenum oxide $MoO_3$, germanium oxide $GeO_2$, or the like is suitable as the material constituting the first support layer 33a and the second support layer 33b.

In FIG. 3, the electrode terminal 34a and the electrode terminal 34b are disposed on the two facing side end surfaces of the power generation layer 30. The electrode terminal 34a is installed on a −y-side end surface (also referred to as a third surface), and the electrode terminal 34b is installed on a +y-side end surface (also referred to as a fourth surface). The electrode terminal 34a and the electrode terminal 34b are terminals for extracting thermoelectromotive force generated in the y direction by the temperature difference dT applied in the −z direction. The electrode terminal 34a and the electrode terminal 34b are made of a material having conductivity.

When the temperature difference dT in the out-of-plane direction (z direction in FIG. 3) is applied to the thermoelectric conversion element 3 having the structure of FIG. 3, the Spin Seebeck Effect is exerted on the magnetic particles 302. When the Spin Seebeck Effect is exerted on the magnetic particles 302, the spin current $J_s$ is generated at the interface between the magnetic network 301 and the magnetic particles 302 as illustrated in FIG. 4. When the spin current $J_s$ is generated at the interface between the magnetic network 301 and the magnetic particles 302, the electromotive force in the in-plane direction is generated in the magnetic network 301 by the Inverse Spin Hall effect.

FIG. 4 conceptually illustrates a state in which a charge current $j_{ISHE}$ flows inside the magnetic network 301 due to the Inverse Spin Hall Effect (ISHE). Since the magnetic network 301 spreads and is dispersed in a network shape in the power generation layer 30, the electromotive force generated in each part of the composite body is added as a whole, and the electromotive force in the in-plane direction (y direction in FIG. 3) is obtained via the electrode terminal 34a and the electrode terminal 34b.

As described above, the thermoelectric conversion element 3 of the present example embodiment has a structure in which the magnetic particles 302 exhibiting the Spin Seebeck Effect are dispersed and held by the magnetic network 301 exhibiting the Anomalous Nernst Effect. That is, the thermoelectric conversion element 3 of the present example embodiment includes the power generation layer 30 including the magnetic network 301 containing the magnetic alloy material and the magnetic particles 302 dispersed inside the magnetic network 301 and exhibiting the Spin Seebeck Effect by application of the temperature gradient.

In the structure of the thermoelectric conversion element 2 of the second example embodiment, since the spin current in the second magnetic layer 22 is relaxed, the power generation efficiency is not efficiently increased even when the power generation layer 30 is thickened. Meanwhile, according to the thermoelectric conversion element 3 of the present example embodiment, the power generation layer 30 is thickened due to the composite structure of the magnetic network 301 exhibiting the Anomalous Nernst Effect and the magnetic particles 302 exhibiting the Spin Seebeck Effect, whereby the power generation efficiency is efficiently increased.

Fourth Example Embodiment

Next, a thermoelectric conversion element according to a fourth example embodiment will be described with reference to the drawings. The thermoelectric conversion element of the present example embodiment includes a power generation layer having a tubular structure made of a conductive magnetic material exhibiting the Anomalous Nernst Effect.

Figure 5:
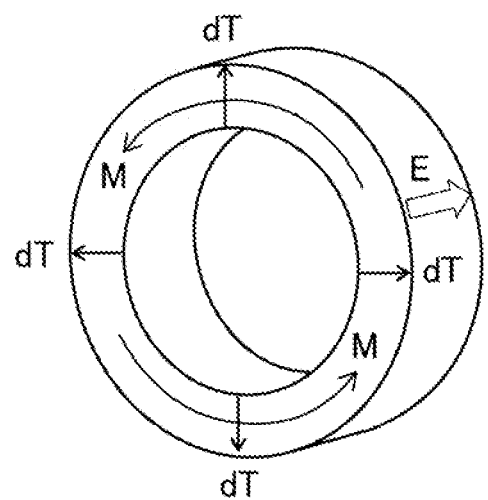
FIG. 5 is a conceptual diagram illustrating a relationship between a structure of a power generation layer having a tubular structure, a temperature gradient, a magnetization direction, and a electromotive force direction.

FIG. 5 is a conceptual diagram illustrating a relationship between a structure of a power generation layer having a tubular structure and a temperature gradient, a magnetization direction, and an electromotive force direction. In the thermoelectric conversion element having a tubular structure, one of a fluid flowing in the tube and a fluid existing outside the tube is used as a heat source or a cold heat source, and the other is used as a heat bath.

Therefore, the temperature difference dT is generated in a thickness direction of the power generation layer constituting the tube, and amount and direction thereof are determined depending on the situation of the temperature inside and outside the tube.

The magnetization of the power generation layer constituting the tube is defined to be in a direction around the tube while being orthogonal to the temperature difference dT as illustrated in FIG. 5. As the defining method, a general method used industrially, such as a method using shape magnetic anisotropy, crystal magnetic anisotropy, or the like, or a magnetization method using a magnetic field generated by a direct charge current, can be utilized.

Figure 6:
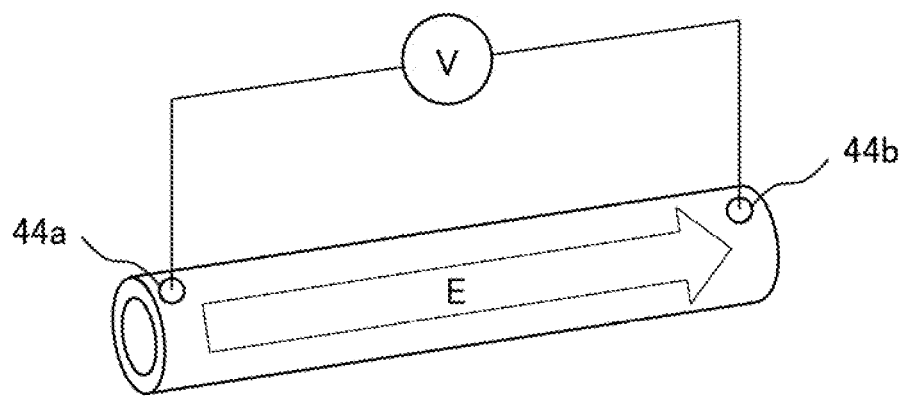
FIG. 6 is a conceptual diagram illustrating a heat flow, an electromotive force, and a magnetization direction in a tubular structure included in a thermoelectric conversion element according to a fourth example embodiment.
Figure 6:
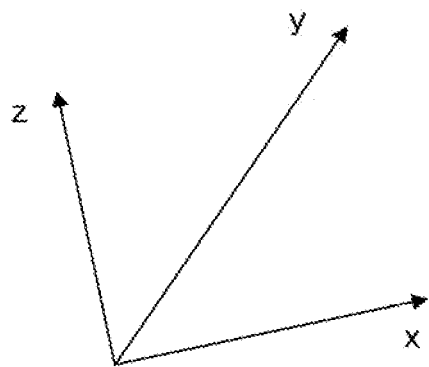

As a result, due to the Anomalous Nernst Effect, as illustrated in FIG. 6, an electromotive force E is generated in an in-plane direction (x direction in FIG. 6) perpendicular to the directions of the temperature difference dT and the magnetization M. Thermoelectric conversion can be performed by extracting the electromotive force E in the in-plane direction (x direction in FIG. 6) perpendicular to the directions of the magnetization M and the temperature difference dT as electricity from between an electrode terminal 44a and an electrode terminal 44b.

Next, the thermoelectric conversion element of the first example embodiment will be specifically described with reference to examples (Example 1).

Example 1

First, an example (Example 1) of the thermoelectric conversion element according to the first example embodiment will be described with reference to the drawings. The thermoelectric conversion element of the present example includes an AlCoSm alloy as a power generation layer.

Figure 7:
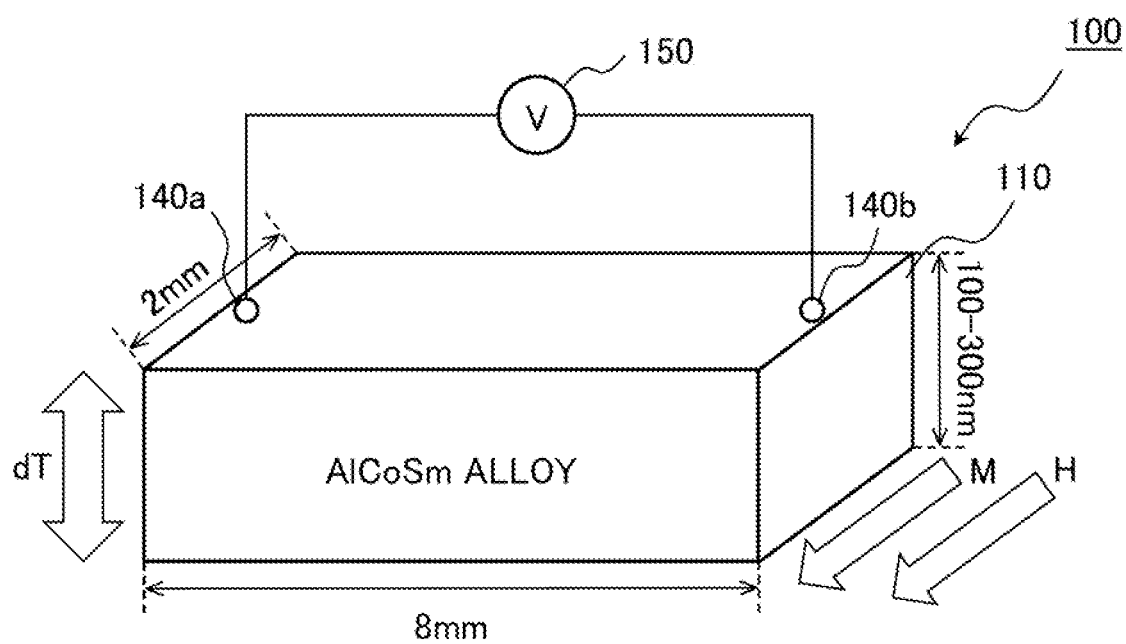
FIG. 7 is a conceptual diagram illustrating an example of a thermoelectric conversion element according to Example 1.

FIG. 7 is a conceptual diagram of a thermoelectric conversion element 100 of the present example. The thermoelectric conversion element 100 has a power generation layer 110 containing an AlCoSm alloy. FIG. 7 illustrates a voltmeter 150 which installs an electrode terminal 140a and an electrode terminal 140b on one main surface of the power generation layer 110 and measures a voltage between the electrode terminal 140a and the electrode terminal 140b.

In order to examine composition ratio dependency of the Anomalous Nernst Effect of the AlCoSm alloy, AlCoSm was deposited on a substrate by a simultaneous sputtering method in a thickness of about 100 nm to 300 nm, a plurality of samples of the thermoelectric conversion element 100 in which the content ratio of AlCoSm was changed was prepared, and a thermoelectromotive force V of each thermoelectric conversion element 100 was measured.

Figure 8:
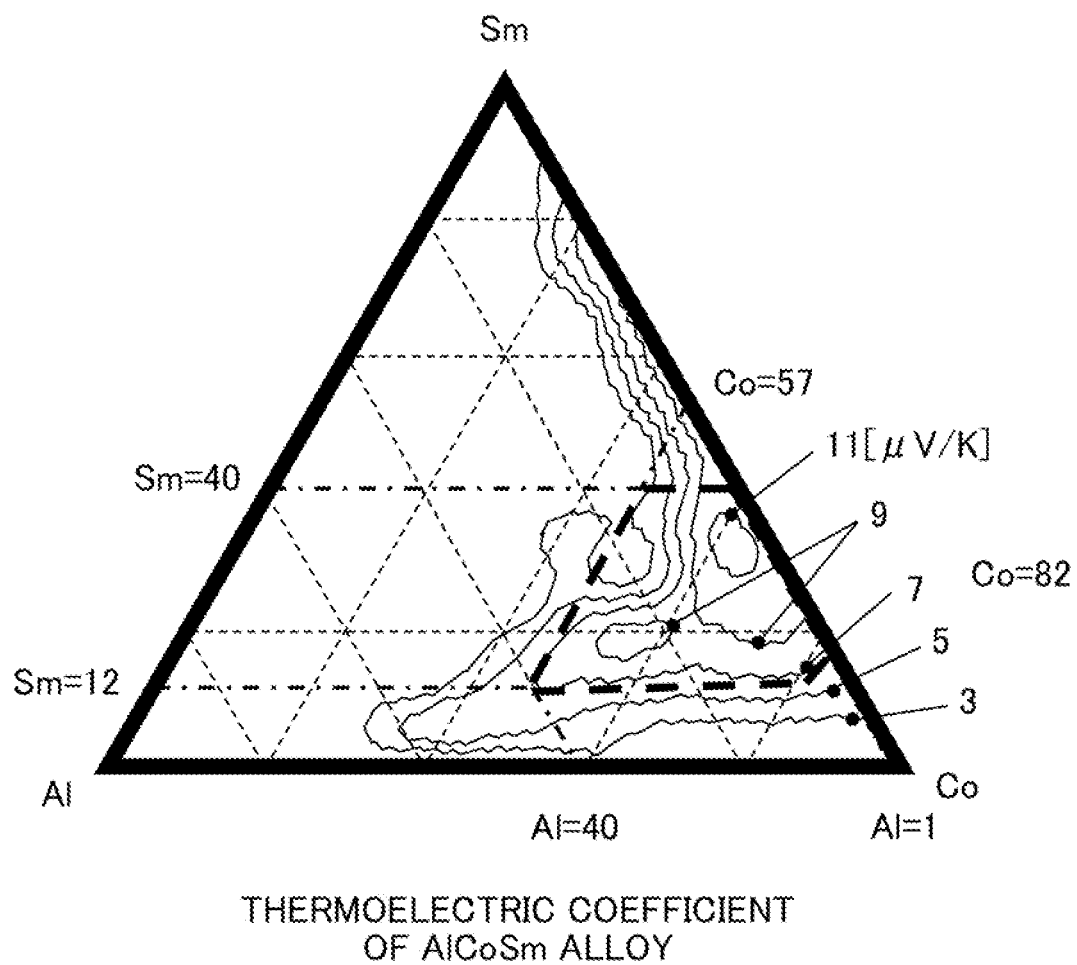
FIG. 8 is a graph illustrating composition ratio dependency of a thermoelectric coefficient of a magnetic alloy material used in a thermoelectric conversion element according to Example 1.

FIG. 8 is a graph illustrating dependence of a normalized thermoelectric coefficient (unit: [μV/K]) on the AlCoSm composition (atomic ratio). Here, the thermoelectric coefficient represents a ratio between the temperature difference dT between both ends of the sample of the thermoelectric conversion element 100 and the thermoelectromotive force V. The normalized thermoelectric coefficient is a value obtained by normalizing the thermoelectric coefficient to a value that does not depend on a length Lz in the z direction and a length Lx in the x direction, and is a value indicating thermoelectric conversion performance inherent in the material.

As indicated by a broken line in FIG. 8, in a composition range in which a composition ratio of Al was 1 at % to 40 at %, a composition ratio of Sm was 12 at % to 40 at %, and a composition ratio of Co was 57 at % to 82 at %, a thermoelectromotive force comparable to or higher than that of the Sm—Co binary alloy was obtained. A larger thermoelectromotive force than that of the Al—Co binary alloy was obtained.

Example 2

In Example 1, a thin film was prepared by a sputtering method, but in the present example, a thermoelectric conversion element of the first example embodiment using a sintered body is illustrated. The thermoelectric conversion element includes an AlCoSm alloy as a power generation layer.

Figure 9:
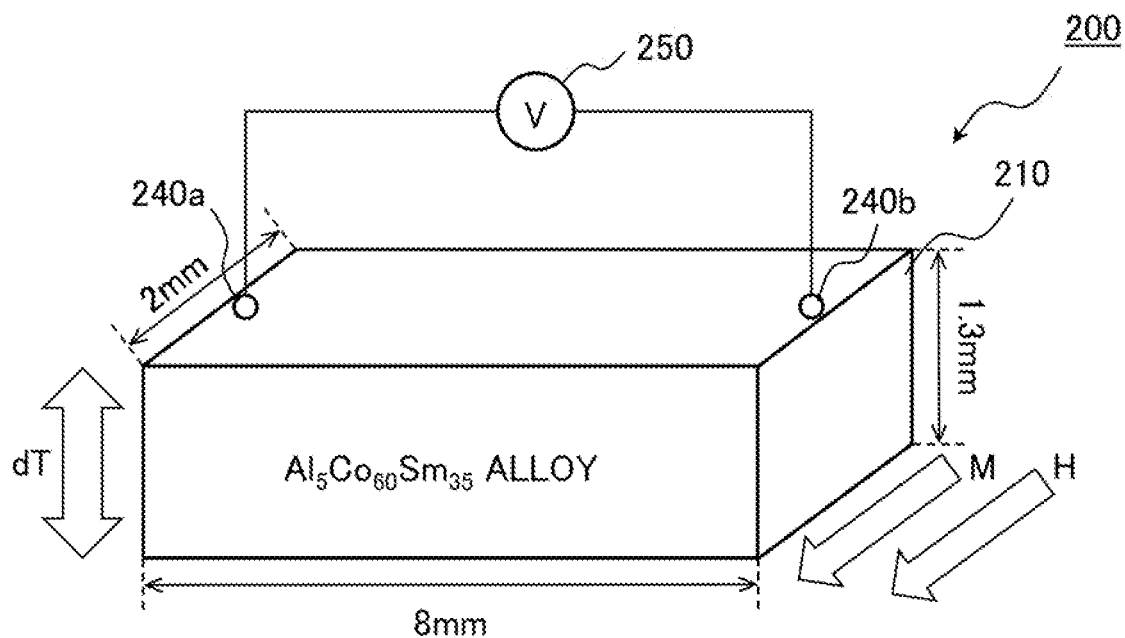
FIG. 9 is a conceptual diagram illustrating an example of a thermoelectric conversion element according to Example 2.

FIG. 9 is a conceptual diagram of a thermoelectric conversion element 200 of the present example. The thermoelectric conversion element 200 has a power generation layer 210 containing $Al_5Co_{60}Sm_{35}$ alloy. Here, the number after each element symbol represents the composition ratio of each element component constituting the alloy.

As illustrated in FIG. 9, an electrode terminal 240a and an electrode terminal 240b are disposed on one main surface of power generation layer 210. A voltmeter 250 measures a voltage between the electrode terminal 240a and the electrode terminal 240b.

In the present example, a sample of the power generation layer 210 was produced by powder metallurgy using a discharge plasma sintering device. First, a Co powder having an average particle size of 4 μm, an Al powder having an average particle size of 3 μm, and a Sm coarse powder having an average particle size of about 800 μm were mixed at an atomic composition ratio of 6:0.5:3.5, and mixed in a mortar for 40 minutes in such a way as to be uniformly mixed, thereby preparing a mixed powder. Next, the mixed powder was filled in a graphite mold, and sintered at 950° C. for 1 hour and 30 minutes in vacuum with a pressure of 50 megapascals (MPa) applied, thereby preparing an AlCoSm alloy.

At the time of measuring the electromotive force by thermoelectric conversion, a copper block having a width of 5 mm was pressed against the center portions of both main surfaces of the thermoelectric conversion element 200 from above and below, one surface was heated, and the other surface was cooled to apply a temperature difference dT (K). Therefore, although the distance between the electrode terminals is about 8 mm, an area of a region where the thermoelectromotive force is generated when the temperature difference is actually applied is a product (10 $mm^2$) of a width (5 mm) of the copper block and a width (2 mm) of the thermoelectric conversion element 200.

Figure 10:
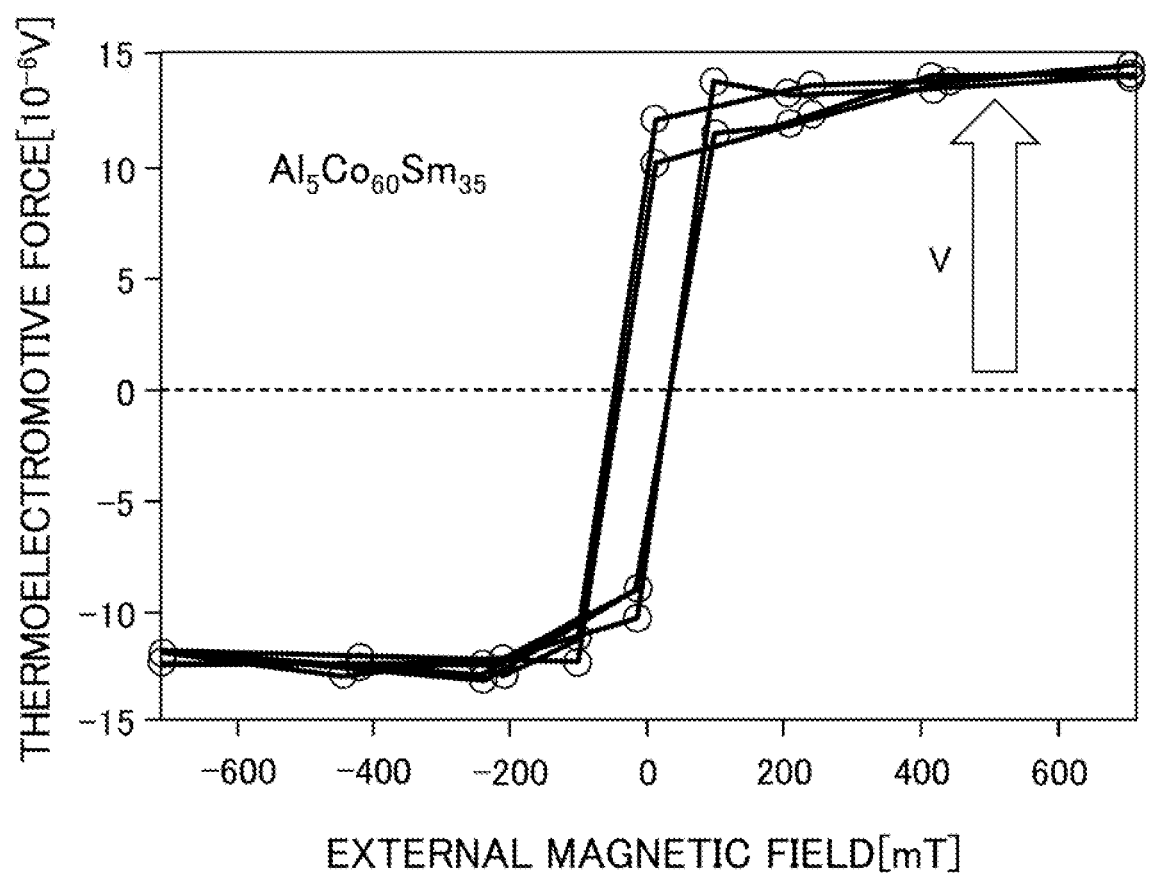
FIG. 10 is a graph illustrating magnetic field dependency of thermoelectromotive force of the magnetic alloy material used for the thermoelectric conversion element according to Example 2.

FIG. 10 is a graph illustrating external magnetic field H dependency of the thermoelectromotive force V generated when temperature difference dT of 2.8 Kelvin (K) is applied between both main surfaces of the thermoelectric conversion element 200. As illustrated in FIG. 10, a thermoelectromotive force was generated in a direction perpendicular to each direction of the temperature difference dT and the external magnetic field H (magnetization M), and a thermoelectromotive force V was generated between the electrode terminal 240 and the electrode terminal 240b.

Figure 11:
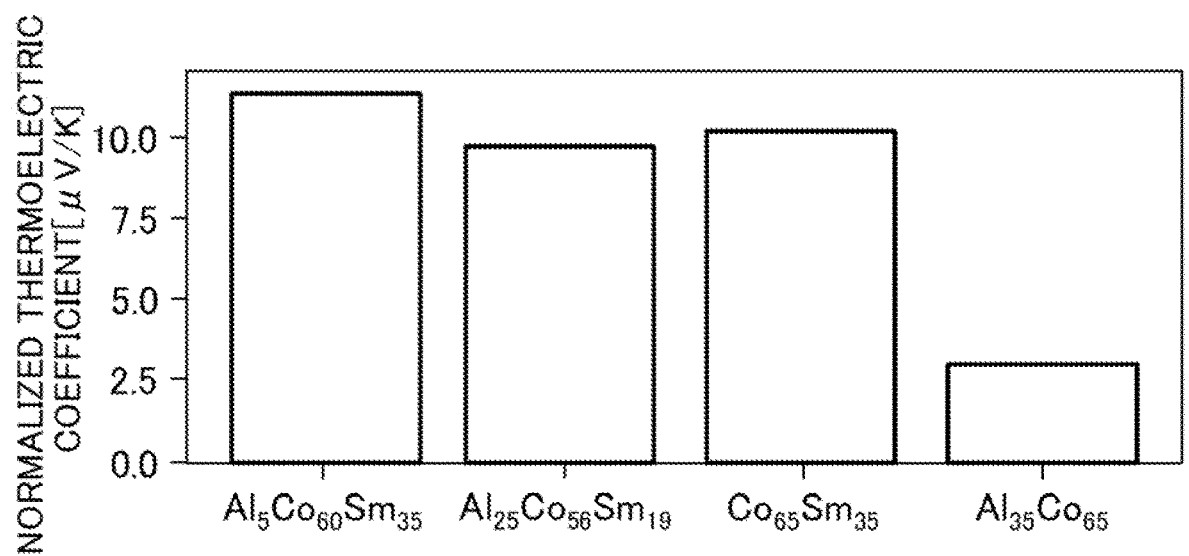
FIG. 11 is a graph comparing thermoelectric coefficients when magnetic alloy materials having different compositions are used for the thermoelectric conversion element according to Example 2.

As illustrated in FIG. 11, when the normalized thermoelectric coefficient (unit: [μV/K]) was compared between the sample of the thermoelectric conversion element 200 having the power generation layer 210 containing the $Al_5Co_{60}Sm_{35}$ alloy of the present example and the thermoelectric element having the power generation layer containing the $Sm_{35}Co_{65}$ alloy produced by the same method except for Al, the normalized thermoelectric coefficient of the sample of the thermoelectric conversion element 200 according to the present example was about 10% larger than that of the $Sm_{35}Co_{65}$ alloy. The normalized thermoelectric coefficient of the sample of the thermoelectric conversion element 200 having the power generation layer 210 containing the $Al_{25}Co_{56}Sm_{19}$ alloy was equivalent to the normalized thermoelectric coefficient of the thermoelectric element having the power generation layer containing the $Sm_{35}Co_{65}$ alloy.

In general, thermoelectric conversion performance may be different between a thin film having a thickness of about several tens to several hundreds of nanometers and a bulk having a thickness equal to more than 10 micrometers. However, according to Examples 1 and 2, it can be seen that thermoelectric conversion performance of the thermoelectric conversion element 200 having the power generation layer 210 containing the AlCoSm alloy can be obtained in both a thin film and a bulk.

Next, the thermoelectric conversion element according to a fourth example embodiment will be specifically described with reference to Examples (Example 3).

Example 3

The composition of the AlCoSm alloy used in the thermoelectric conversion element is $Al_5Co_{60}Sm_{35}$. First, a round bar was produced from a bulk melt by a rolling method, and then a hollow tubular structure was produced by the same rolling. The element has an outer diameter of 8 mm, an inner diameter of 6 mm, and a length of 1 m.

Subsequently, magnetization was performed for use as a thermoelectric conversion module (thermoelectric conversion element). The magnetization was performed by disposing a copper wire for magnetization so as to penetrate the inside of the tube and applying a DC pulse current. Subsequently, in order to produce a coating film for insulation on the inner and outer walls of the tube, a polymer film was vapor-deposited by exposure to parylene vapor in vacuum. The thickness of the polymer film is estimated to be 1 μm at most. Since the polymer film was formed on the entire surface of the tube, it was confirmed that the polymer film was removed and the AlCoSm alloy and the electrode terminal were electrically in good contact with each other at a place where the electrode terminal was installed.

The module produced in the above steps has an estimated thermoelectric conversion coefficient of 5 mV/K and a thermal conductivity of 15 W/mK.

When the outside of this module was brought into contact with a sufficient amount of cooling water bath of 25° C. and hot water of about 100° C. was introduced into the inside at a flow rate of 5 L/min, a temperature difference of about 4 K occurred in the thermoelectric conversion member having a thickness of about 1 mm, and a thermoelectromotive force of about 20 mV was generated due to the Anomalous Nernst Effect. A maximum extraction power of about 10 mW could be obtained outside the module.

(Thermoelectromotive Force Due to Synergistic Effect of Seebeck Effect and Anomalous Nernst Effect)

Due to the temperature difference existing in a longitudinal direction of the tubular structure (FIG. 5), the electromotive force due to the Seebeck effect is generated with a magnitude equal to or larger than that of the anomalous Nernst electromotive force. When actually used as a power source, it is preferable to use both electromotive forces as one thermoelectromotive force without distinguishing both electromotive forces. For this purpose, it is essential to adopt a configuration in which the Seebeck electromotive force and the anomalous Nernst electromotive force are integrated without canceling each other by appropriately selecting the magnetization direction of the thermoelectric conversion module made of an AlCoSm alloy in accordance with the sign of the Seebeck electromotive force determined according to the temperature difference between the heat source and the heat bath to be used for trial and the direction in which the fluid flows in the tubular structure.

Although the present disclosure has been described with reference to the example embodiments and examples, the present disclosure is not limited to the above example embodiments and examples. Various modifications that can be understood by those skilled in the art can be made to the configurations and details of the above example embodiments and examples within the scope of the present disclosure.

The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. A thermoelectric conversion element comprising:
   a magnetic alloy material containing aluminum, cobalt, and samarium; and
   a thermoelectric conversion layer,
   wherein in the thermoelectric conversion layer:
      a content of aluminum in the magnetic alloy material is in a range of 1 atomic percent to 40 atomic percent,
      a content of samarium in the magnetic alloy material is in a range of 12 atomic percent to 40 atomic percent, and
      a content of cobalt in the magnetic alloy material is in a range of 57 atomic percent to 82 atomic percent.

2. The thermoelectric conversion element according to claim 1, wherein when a temperature gradient is applied, the thermoelectric conversion layer generates an electromotive force in a direction substantially perpendicular to each of a magnetization direction of the magnetic alloy material and a direction of the applied temperature gradient.

3. The thermoelectric conversion element according to claim 1, wherein the thermoelectric conversion layer includes two facing main surfaces, and when the magnetic alloy material is magnetized in an in-plane direction of the main surface and a temperature gradient is applied in an out-of-plane direction of the main surface, generates an electromotive force in a direction substantially perpendicular to each of a magnetization direction of the magnetic alloy material and a direction of the applied temperature gradient.

4. The thermoelectric conversion element according to claim 1, wherein when a charge current flows, the thermoelectric conversion layer generates a temperature gradient in a direction substantially perpendicular to each of a magnetization direction of the magnetic alloy material and a direction of the flowing charge current.

5. The thermoelectric conversion element according to claim 1, wherein the thermoelectric conversion layer includes two facing main surfaces, and when the magnetic alloy material is magnetized in an in-plane direction of the main surface and a charge current flows in an in-plane direction substantially perpendicular to a magnetization direction in the main surface, generates a temperature gradient in a direction substantially perpendicular to each of a magnetization direction of the magnetic alloy material and a direction of the flowing charge current.

6. The thermoelectric conversion element according to claim 1, wherein a composition ratio of aluminum in the magnetic alloy material is equal to or more than 15 atomic percent and less than 35 atomic percent, a composition ratio of samarium is equal to or more than 15 atomic percent and less than 25 atomic percent, and a composition ratio of cobalt is equal to or more than 57 atomic percent and less than 65 atomic percent.

7. The thermoelectric conversion element according to claim 1, wherein a composition ratio of aluminum in the magnetic alloy material is equal to or more than 1 atomic percent and less than 10 atomic percent, a composition ratio of samarium is equal to or more than 25 atomic percent and less than 40 atomic percent, and a composition ratio of cobalt is equal to or more than 55 atomic percent and less than 70 atomic percent.

8. The thermoelectric conversion element according to claim 1, wherein the thermoelectric conversion layer comprises:
   a first magnetic layer comprising the magnetic alloy material, and
   a second magnetic layer that exhibits the Spin Seebeck Effect by application of a temperature gradient.

9. The thermoelectric conversion element according to claim 8, wherein a thickness of the first magnetic layer is equal to or less than 100 nanometers.

10. The thermoelectric conversion element according to claim 1, wherein the thermoelectric conversion layer includes
   a magnetic network comprising the magnetic alloy material, and
   magnetic particles dispersed inside the magnetic network and exhibiting the Spin Seebeck Effect by application of a temperature gradient.

* * * * *